(12) United States Patent
Cheng et al.

(10) Patent No.: US 10,313,165 B2
(45) Date of Patent: Jun. 4, 2019

(54) FINITE IMPULSE RESPONSE ANALOG RECEIVE FILTER WITH AMPLIFIER-BASED DELAY CHAIN

(71) Applicant: Credo Technology Group Limited, Grand Cayman (KY)

(72) Inventors: Lawrence Chi Fung Cheng, San Jose, CA (US); Haihui Luo, San Jose, CA (US)

(73) Assignee: Credo Technology Group Limited, Grand Cayman (KY)

( * ) Notice: Subject to any disclaimer, the term of this patent is extended or adjusted under 35 U.S.C. 154(b) by 0 days.

(21) Appl. No.: 15/453,774

(22) Filed: Mar. 8, 2017

(65) Prior Publication Data

US 2018/0262374 A1    Sep. 13, 2018

(51) Int. Cl.
  *H03F 3/21*    (2006.01)
  *H03F 3/193*    (2006.01)
  (Continued)

(52) U.S. Cl.
  CPC ............. *H04L 27/01* (2013.01); *H03F 3/193* (2013.01); *H03F 3/211* (2013.01);
  (Continued)

(58) Field of Classification Search
  CPC ............... H04L 25/03; H04L 25/03343; H04L 25/03433; H04L 25/03535;
  (Continued)

(56) References Cited

U.S. PATENT DOCUMENTS

| 5,392,042 | A | * | 2/1995 | Pellon | ................... | H03M 3/404 |
| | | | | | | 333/166 |
| 7,301,997 | B1 | * | 11/2007 | Wang | ................. | H04B 10/6971 |
| | | | | | | 333/18 |

(Continued)

OTHER PUBLICATIONS

Agrawal, Ankur, et al.; A 19-Gb/s Serial Link Receiver With Both 4-Tap FFE and 5-Tap DFE Functions in 45-nm SOI CMOS; IEEE J. Solid-State Circuits; Dec. 2012; pp. 3220-3231; vol. 47 No. 12.

(Continued)

*Primary Examiner* — Young T Tse
(74) *Attorney, Agent, or Firm* — Ramey & Schwaller, LLP; Daniel J. Krueger

(57) ABSTRACT

High-data rate channel interface modules and equalization methods employing a finite impulse response (FIR) analog receive filter. Embodiments include an illustrative channel interface module having multiple amplifier-based delay units arranged in a sequential chain to convert an analog input signal into a set of increasingly-delayed analog signals that are weighted and combined together with the analog input signal to form an equalized signal; and a symbol decision element operating on the equalized signal to obtain a sequence of symbol decisions. An interface that extracts received data from the sequence of symbol decisions. The delay units may employ one or more delay cells each having a common-source amplifier stage followed by a source follower output stage, the two stages providing approximately equal portions of the propagation delay. An enhanced gate-to-drain capacitance in the common-source amplifier may increase propagation delay while reducing bandwidth limitations.

13 Claims, 6 Drawing Sheets

(51) Int. Cl.
*H04L 25/03* (2006.01)
*H04L 27/01* (2006.01)
*H03F 3/45* (2006.01)
*H03G 5/28* (2006.01)
*H03H 11/26* (2006.01)
*H03H 15/02* (2006.01)

(52) U.S. Cl.
CPC .......... *H03F 3/45201* (2013.01); *H03G 5/28* (2013.01); *H04L 25/03044* (2013.01); *H04L 25/03878* (2013.01); *H03F 2200/451* (2013.01); *H03F 2203/45361* (2013.01); *H03H 11/26* (2013.01); *H03H 15/02* (2013.01); *H04L 25/03031* (2013.01)

(58) Field of Classification Search
CPC ......... H04L 25/03592; H04L 25/03828; H04L 25/03878; H04L 25/03885; H04L 27/01; H04L 25/03031; H03F 3/19; H03F 3/193; H03F 3/1935; H03F 3/42; H03F 3/45; H03F 3/45071; H03F 3/4508; H03F 3/45179; H03F 3/211; H03F 2200/451; H03F 2203/45361; H03G 3/30; H03G 3/3015
USPC ....... 375/219, 220, 222, 229, 232, 233, 257; 330/250, 278, 285, 296, 304, 310, 69, 330/133
See application file for complete search history.

(56) References Cited

U.S. PATENT DOCUMENTS

| | | | |
|---|---|---|---|
| 9,020,065 B2* | 4/2015 | Wyville | H04B 1/0475 333/24 R |
| 9,667,407 B1 | 5/2017 | Liu et al. | |
| 2004/0001540 A1* | 1/2004 | Jones | H04L 25/03146 375/231 |
| 2006/0044061 A1* | 3/2006 | Mukherjee | H03F 3/45183 330/253 |
| 2007/0025224 A1* | 2/2007 | Tatsuzawa | G11B 20/10009 369/59.22 |
| 2007/0030890 A1* | 2/2007 | Yamaguchi | H04L 25/03044 375/233 |
| 2008/0260066 A1* | 10/2008 | Cai | H03F 1/3294 375/297 |
| 2018/0234270 A1* | 8/2018 | Kimura | H04L 25/03025 |

OTHER PUBLICATIONS

Jaussi, J.E., et al.; 8-Gb/s source-synchronous I/O link with adaptive receiver equalization, offset cancellation, and clock de-skew; IEEE J. Solid-State Circuits; Jan. 2005; pp. 80-88; vol. 40 No. 1.

Momtaz, A., et al.; An 80 mW 40 Gb/s 7-tap T/2-spaced feed-forward equalizer in 65 nm CMOS; IEEE J. Solid-State Circuits; Mar. 2010; pp. 629-639; vol. 45 No. 3.

Frian, Edward, et al.; CEI-56G-VSR-PAM4 Very Short Reach Interface; Common Electrical I/O; Jun. 10, 2016; Optical Internetworking Forum.

\* cited by examiner

FINITE IMPULSE RESPONSE ANALOG RECEIVE FILTER WITH AMPLIFIER-BASED DELAY CHAIN

BACKGROUND

Digital communications occur between sending and receiving devices over an intermediate communications medium, or "channel" (e.g., a fiber optic cable or insulated copper wires). Each sending device typically transmits symbols at a fixed symbol rate, while each receiving device detects a (potentially corrupted) sequence of symbols and attempts to reconstruct the transmitted data. A "symbol" is a state or significant condition of the channel that persists for a fixed period of time, called a "symbol interval." A symbol may be, for example, an electrical voltage or current level, an optical power level, a phase value, or a particular frequency or wavelength. A change from one channel state to another is called a symbol transition. Each symbol may represent (i.e., encode) one or more binary bits of the data. Alternatively, the data may be represented by symbol transitions, or by sequences of two or more symbols.

Many digital communication links use only one bit per symbol; a binary '0' is represented by one symbol (e.g., an electrical voltage or current signal within a first range), and binary '1' by another symbol (e.g., an electrical voltage or current signal within a second range), but higher-order signal constellations are known and frequently used. In 4-level pulse amplitude modulation (PAM4), each symbol interval may carry any one of four symbols, typically denoted as −3, −1, +1, and +3. Two binary bits can thus be represented by each symbol.

Channel non-idealities produce dispersion which may cause each symbol to perturb its neighboring symbols, causing intersymbol interference (ISI). ISI can make it difficult for the receiving device to determine which symbols were sent in each interval, particularly when such ISI is combined with additive noise.

To combat noise and ISI, receiving devices may employ various equalization techniques including, for example, linear equalization and decision feedback equalization, either of which can take on different implementation structures that can operate in the continuous time domain, the digital domain, or a combination thereof. Each option presents certain potential advantages and disadvantages. For example, decision feedback equalizer may be desired for their ability to combat ISI without inherent noise amplification, but their feedback path becomes very challenging to implement at high data rates. As another example, digital domain equalization may be desired for its flexibility, but it requires analog-to-digital conversion beforehand with a commensurate power consumption demand that becomes prohibitive at high data rates.

One of the available equalization techniques is feed-forward equalization (FFE), a form of linear equalization employing a delay line with evenly spaced taps to implement a finite impulse response (FIR) filter. The filter is traditionally designed to minimize ISI and/or mean-square error between the equalized signal and the ideal (ISI and noise-free) transmit signal, subject to constraints existing on the number and resolution of the filter coefficients. In the high-data rate applications, the FFE implementation has been proposed in three forms: digital domain, analog sample-and-hold, and LC-based delay line. As previously mentioned, digital domain equalization (including FFE) imposes undesirably high power consumption requirements to digitize the receive signal with the necessary resolution at rates exceeding 10 GHz.

Analog sample and hold implementations, such as those proposed by Ankur Agrawal, et al., "A 19-Gb/s Serial Link Receiver With Both 4-Tap FFE and 5-Tap DFE Functions in 45-nm SOI CMOS", IEEE J. Solid-State Circuits, vol. 47, no. 12, pp. 3220-3231, December 2012; and J. E. Jaussi et al., "8-Gb/s source-synchronous I/O link with adaptive receiver equalization, offset cancellation, and clock de-skew," IEEE J. Solid-State Circuits, vol. 40, no. 1, pp. 80-88, January 2005; appear to provide accurate line delays, but at the needed data rates they also impose undesirably high power requirements for clock distribution, sampling switches, and buffers. Moreover, sample-and-hold implementations do not (without additional mechanisms such as oversampling) enable the use of the popular Alexander or Mueller-Muller techniques for recovering the clock from the data.

LC-based delay lines, such as that proposed by A. Momtaz and M. M. Green, "An 80 mW 40 Gb/s 7-tap T/2-spaced feed-forward equalizer in 65 nm CMOS," IEEE J. Solid-State Circuits, vol. 45, no. 3, pp. 629-639, March 2010, consume large chip areas and require re-design whenever the tap delays must be adjusted. Thus the available FFE implementations are unsatisfactory.

SUMMARY

Accordingly, there are disclosed herein a high-speed finite impulse response (FIR) analog receive filter, a channel interface module, and equalization methods employing such a filter. An illustrative channel interface module includes: multiple amplifier-based delay units arranged in a sequential chain to convert an analog input signal into a set of increasingly-delayed analog signals that are weighted and combined together with the analog input signal to form an equalized signal; a symbol decision element operating on the equalized signal to obtain a sequence of symbol decisions; and an interface that extracts received data from the sequence of symbol decisions.

An illustrative method for providing high speed equalization includes: obtaining an analog receive signal from a communications channel; using a chain of amplifier-based delay units to convert the analog receive signal into a set of increasingly-delayed analog signals that are weighted and combined together with the analog input signal to form an equalized signal; sampling the equalized analog signal to obtain a sequence of symbol decisions; and extracting received data from the sequence of symbol decisions.

Each of the foregoing may be implemented individually or in combination, alone or together with any one or more of the following features in any suitable combination: (1) each amplifier-based delay unit includes one or more delay cells. (2) each delay cell includes a cascode amplifier with a source follower output stage. (3) an arrangement of amplifier-based summer units that weight and combine together the set of increasingly-delayed analog signals together with the analog input signal to form the equalized signals. (4) each amplifier-based summer unit includes: a common source amplifier for each of two input signals, the two common source amplifiers additively combining currents through a cascode transistor; and a source follower output stage. (5) the cascode amplifier within each delay cell includes: a MOS (metal-oxide-semiconductor) transistor with a gate that receives a delay cell input signal; and a gate-to-drain capacitance in excess of an intrinsic value for the MOS transistor. (6) the gate-to-drain capacitance is provided by routing a conductor to the gate in close proximity to a drain of the MOS transistor or a conductor connected to said drain. (7) each amplifier-based delay unit comprises a sequence of multiple delay cells. (8) each amplifier-based delay unit comprises one or more delay cells each including: a differential common source amplifier with adjustable source degeneration for gain control. (9) the differential common source amplifier within each delay cell includes: a pair of MOS transistors with gates that receive a differential input signal to the delay cell and drains that each are coupled to the respective gate by a gate-to-drain capacitance in excess of an intrinsic value for the MOS transistors. (10) each delay cell further includes: cascode transistors for the differential common source amplifier; and source-follower configured output transistors to drive differential output signals from the delay cell. (11) each delay cell further includes: adjustable current sources coupled to the cascode transistors that set a common mode voltage of the differential output signals to bias a subsequent delay cell without series capacitive coupling. (12) an arrangement of amplifier-based summer units that weight and combine together the set of increasingly-delayed analog signals together with the analog input signal to form the equalized signals. (13) each amplifier-based summer unit includes: a differential common source amplifier for each of two input signals, the two differential common source amplifiers additively combining currents through a cascode transistor stage, each of the two differential common source amplifiers having adjustable source degeneration for independent gain control; and a source-follower stage that drives differential output signals from the amplifier-based summer unit. (14) said using includes, for each delay cell: receiving a delay cell input signal with a gate of a MOS transistor in a cascade amplifier configuration; and buffering an output of the delay cell with a source follower output stage. (15) weighting and combining the set of increasingly-delayed analog signals, together with the analog input signal, with an arrangement of amplifier-based summer units each having a source follower output stage that buffers combined currents from common source amplifiers operating on multiple input signals to the summer unit. (16) said receiving includes coupling the input signal from the gate to a drain of the MOS transistor with a gate-to-drain capacitance in excess of an intrinsic value for the MOS transistor. (17) the analog receive signal is a differential signal, and each amplifier-based delay unit accepts a differential input signal with a differential cascode amplifier stage and provides a differential output signal with an output buffer stage. (18) each of said amplifier-based delay units comprises one or more delay cells, and wherein said using includes, for each delay cell: receiving a differential delay cell input signal with gates of two MOS transistors in a differential common source amplifier configuration; and buffering a differential output of the delay cell with source-follower configured output transistors. (19) said receiving includes coupling each gate to a respective drain of the MOS transistors with a gate-to-drain capacitance in excess of an intrinsic value for the MOS transistor. (20) the gate-to-drain capacitances are provided by routing gate conductors in close proximity to the respective drains or in close proximity to conductors connected to said drains.

Figure 1:
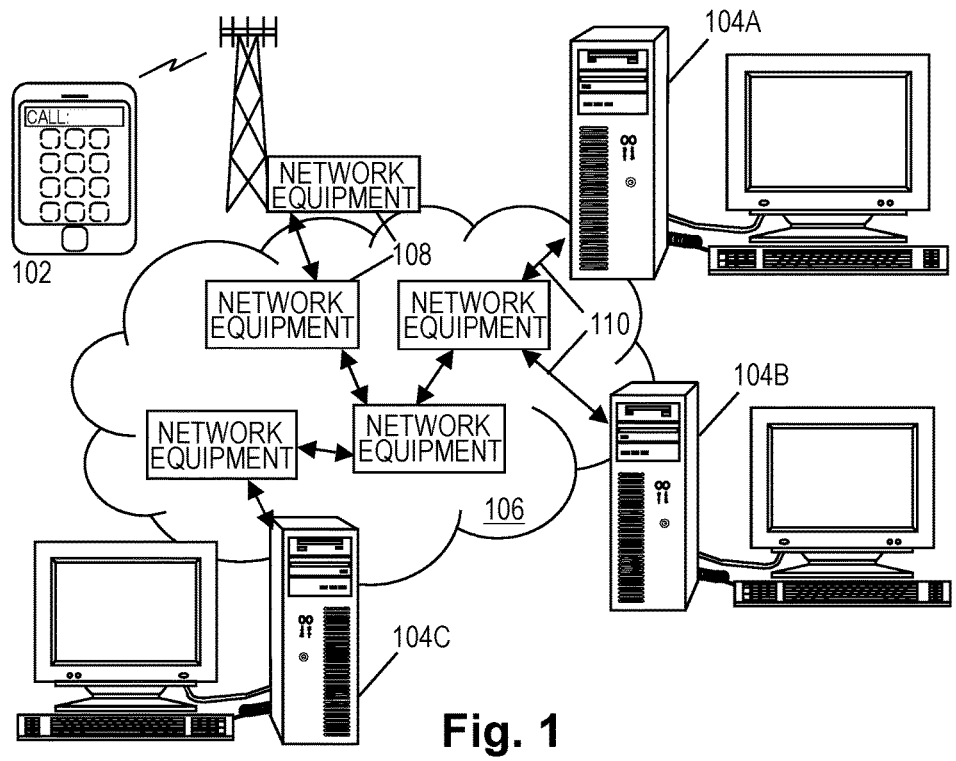
FIG. 1 shows an illustrative computer network.

It should be understood, however, that the specific embodiments given in the drawings and detailed description do not limit the disclosure. On the contrary, they provide the foundation for one of ordinary skill to discern the alternative forms, equivalents, and modifications that are encompassed in the scope of the appended claims.

DETAILED DESCRIPTION

The disclosed apparatus and methods are best understood in the context of the larger environments in which they operate. Accordingly, FIG. 1 shows an illustrative communications network 100 including mobile devices 102 and computer systems 104A-C coupled via a routing network 106. The routing network 106 may be or include, for example, the Internet, a wide area network, or a local area network. In FIG. 1, the routing network 106 includes a network of equipment items 108, such as switches, routers, and the like. The equipment items 108 are connected to one another, and to the computer systems 104A-C, via point-to-point communication links 110 that transport data between the various network components.

Figure 2:
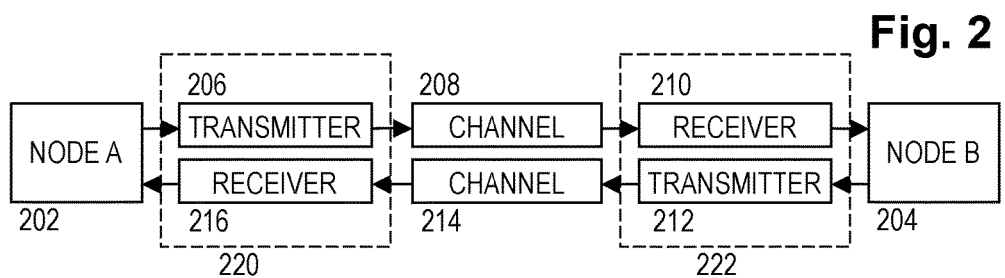
FIG. 2 is a function-block diagram of an illustrative point-to-point communication link.

FIG. 2 is a diagram of an illustrative point-to-point communication link that may be representative of links 110 in FIG. 1. The illustrated embodiment includes a first node 202 ("Node A") in communication with a second node 204 ("Node B"). Nodes A & B can each be, for example, any one of mobile devices 102, equipment items 108, computer systems 104A-C, or other sending/receiving devices suitable for high-rate digital data communications.

Coupled to Node A is a transceiver 220, and coupled to Node B is a transceiver 222. Communication channels 208 and 214 extend between the transceivers 220 and 222. The channels 208 and 214 may include, for example, transmission media such as fiber optic cables, twisted pair wires, coaxial cables, backplane transmission lines, and wireless communication links. (It is also possible for the channel to be a magnetic or optical information storage medium, with the write-read transducers serving as transmitters and receivers.) Bidirectional communication between Node A and Node B can be provided using separate channels 208 and 214, or in some embodiments, a single channel that transports signals in opposing directions without interference.

A transmitter 206 of the transceiver 220 receives data from Node A and transmits the data to the transceiver 222 via a signal on the channel 208. The channel signal may be, for example, an electrical voltage, an electrical current, an optical power level, a wavelength, a frequency, or a phase value. A receiver 210 of the transceiver 222 receives the signal via the channel 208, uses the signal to reconstruct the transmitted data, and provides the data to Node B. Similarly, a transmitter 212 of the transceiver 222 receives data from Node B, and transmits the data to the transceiver 220 via a signal on the channel 214. A receiver 216 of the transceiver 220 receives the signal via the channel 214, uses the signal to reconstruct the transmitted data, and provides the data to Node A.

Figure 3:
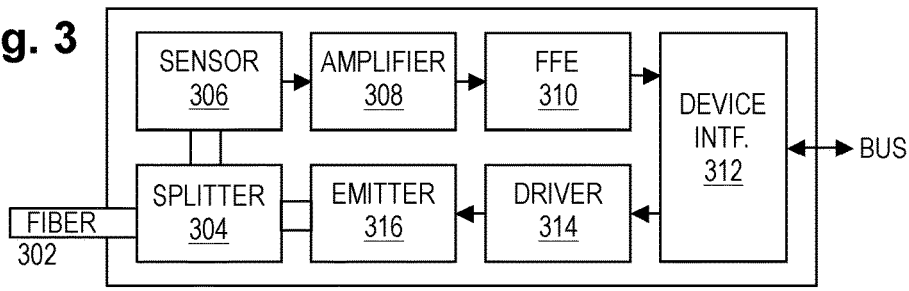
FIG. 3 is a function-block diagram of an illustrative fiber optic interface module.

FIG. 3 illustrates a transceiver embodiment specific to fiber optic signaling with a function block diagram of an illustrative fiber optic interface module. The optical fiber 302 couples to a splitter 304 which creates two optical paths to the fiber: one for receiving and one for transmitting. A sensor 306 is positioned on the receiving path to convert one or more received optical signals into corresponding analog (electrical) receive signals that are amplified by amplifier 308 in preparation for processing by a feed forward equalizer (FFE) module 310. The FFE module 310 converts the received signal into a sequence of symbol decisions. A device interface 312 buffers the sequence of symbol decisions and, in at least some embodiments, includes forward error correction (FEC) decoding and payload extraction logic to derive a received data stream from the sequence of symbol decisions. The device interface 312 then makes the received data stream available to the host node via an internal data bus in accordance with a standard I/O bus protocol.

Conversely, data for transmission can be communicated by the host node via the bus to device interface 312. In at least some embodiments, the device interface 312 packetizes the data with appropriate headers and end-of-frame markers, optionally adding a layer of FEC coding and/or a checksum. Driver 314 accepts a transmit data stream from interface 312 and converts the transmit data stream into an analog electrical drive signal for emitter 316, causing the emitter to generate optical channel signals that are coupled via splitter 304 to the optical fiber 302.

Figure 4:
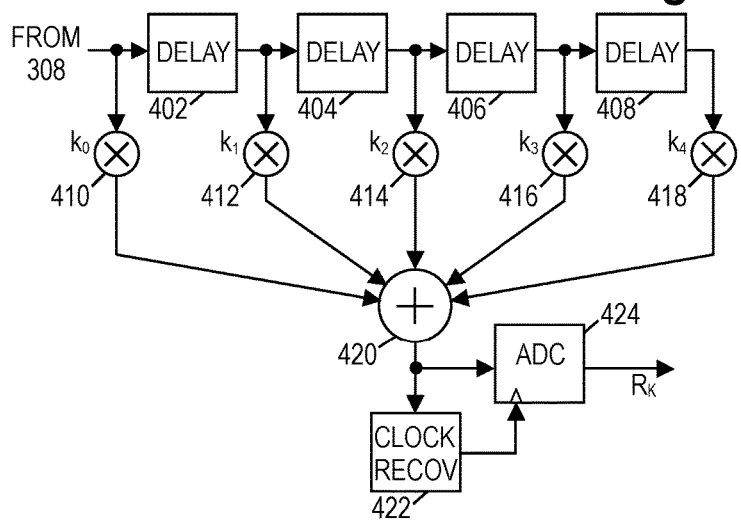
FIG. 4 shows an illustrative textbook feed forward equalizer (FFE) implementation.

As previously mentioned, a FFE module 310 is included in the receive chain to combat intersymbol interference (ISI) that results from signal dispersion in the channel. FIG. 4 shows an illustrative "textbook" implementation of a finite impulse response (FIR) analog receive filter contemplated for use in module 310. An analog input signal is passed along a chain of delay units 402, 404, 406, 408. Four delay units are shown here, but the number can vary as needed. All but the last delay unit 408 pass a delayed version of the input signal to the subsequent delay unit, so that the chain creates a set of increasingly-delayed versions of the input signal. The initial input signal and each of the delayed versions are provided in parallel to five multipliers 410, 412, 414, 416, and 418, which each scale their received signal by a corresponding coefficient value $k_0$ through $k_4$, which are preferably adjustable to permit adaptation to the channel. A summing node 420 sums the coefficient-weighted signals to provide an equalized analog signal. A clock recovery module 422 extracts a clock signal from the equalized analog signal using, e.g., the Alexander, Mueller-Muller, or other suitable clock recovery technique, and supplies the recovered clock signal to a digitizer or decision element 424. The digitizer/decision element 424 samples the equalized analog signal in accordance with the clock signal and provides a sequence of symbol decisions to the device interface 312, which in turn extracts the data represented by the symbol decision sequence.

Note that prior to the operation of the FFE module 310, the amplifier 308 may, in addition to amplifying the receive signal, provide continuous time filtering to shape the signal spectrum in an adjustable fashion. For example, the amplifier 308 may be a peaking amplifier, i.e., an amplifier with increased gain for frequencies just below a band-limiting high frequency roll-off. The resulting peak in the amplifier's transfer function combats the channel's attenuation of high-frequency signal components, thereby improving the receive signal's high frequency characteristics. Yet if employed, such a peaking amplifier would generally have a limited tuning capability, and in any event the shape of the transfer function may be unsuitable for proper correction of the channel loss profile and consequent elimination of ISI. (In fact, the peaking amplifier can in some circumstances provide too much high frequency boosting, introducing post-transition oscillation with an undesirable increase in ISI.)

In contrast, the FIR receive filter provides multiple adjustable taps with the needed flexibility for minimizing ISI and/or noise at the symbol sampling intervals. However, adapting the FIR receive filter for operation at high data rates presents certain challenges. For example, each delay unit 402-408 must delay the analog input signal with minimal distortion. The required delay is usually the inverse of the symbol rate (35.7 ps for a symbol rate of 28 GHz, which is the symbol rate of a 56 Gbps PAM4 or 28 Gbps NRZ modulation), though it may be smaller for fractionally-spaced equalization, and the delay units should pass the highest signal frequency (e.g., the signal associated with an alternating symbol pattern, i.e., 14 GHz for a symbol rate of 28 GHz) with minimal attenuation, necessitating a very broadband response with a substantially uniform group delay. A first-order low-pass system would be inadequate. A 35.7 ps delay implemented with a single first-order low-pass system requires 35.7 ps time constant. Such a time constant, corresponds to a 3 dB bandwidth of 28 Grad/s (about 4.46 GHz), which is the point at which the group delay will have fallen by 50% from its low-frequency value of 35.7 ps. The resulting distortion would prevent the FIR receive filter from performing adequately. This observation applies for a range for signal bandwidths and delays (up to 100 ps or more).

In addition, when adapting the FIR receive filter design for high data rate operation, the designer should account for any delays imposed by other components and ensure that such delays are not unduly influenced by adjustment of the coefficient values.

Figure 5A:
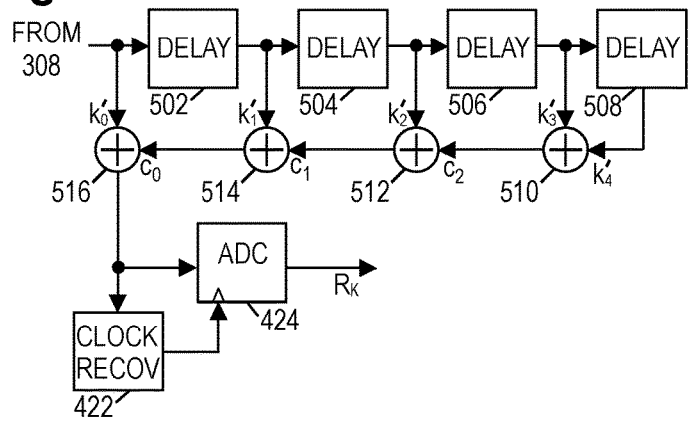
FIG. 5A shows an illustrative high-rate FFE implementation.

FIG. 5A shows an FIR receive filter implementation adapted for high data rates. Among other things, this implementation design employs a chain of amplifier-based delay units 502, 504, 506, and 508; eliminates the multipliers 410-418 which might be expected to cause delays dependent upon coefficient values; and eliminates the central summing node 420, as such a node could be expected to introduce a large capacitive loading that would degrade the signal path bandwidth. Instead, the central summing node is replaced with a sequence of two-input summers 510, 512, 514, 516, with adjustable input weightings. As with the textbook delay chain of FIG. 4, the amplifier-based delay units 502, 504, 506, and 508, pass the analog input signal from one unit to the next to create a set of increasingly-delayed versions of the input signal. As before, the number of delay units can be varied as needed.

Unlike the delay chain of FIG. 4, each of the delay units 502-508 may be equipped with a controllable gain factor. The summers may operate in a pipelined fashion similar to the delay units. Summer 510 combines the delayed signals from delay units 506 & 508, weighting the signals as indicated by coefficients $k_3'$ and $k_4'$. To the output of summer 510, summer 512 adds the delayed signal from unit 504, weighted as indicated by coefficients $k_2'$ and $c_2$. To the output of summer 512, summer 514 similarly adds the delayed signal from unit 502, weighted as indicated by coefficients $k_1'$ and $c_1$. To the output of summer 514, summer 516 adds the analog input signal, weighted as indicated by coefficients $k_0'$ and $c_0$. The output of summer 516 is the equalized signal provided to the clock recovery module 422 and digitizer or decision element 424. The delay unit gains and the coefficients $k_0'$-$k_4'$, $c_0$-$c_2$ combine to provide effective coefficients that can be mapped to $k_0$-$k_4$ in FIG. 4. The variety of controllable coefficients and gains adds to the flexibility of FFE adaptation, enabling the receive filter to better compensate for specific channel loss profile.

Figure 5B:
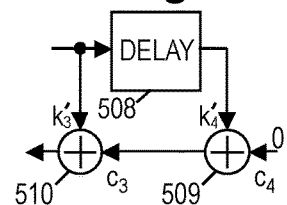
FIG. 5B shows a design variation on the illustrative high-rate FFE implementation.

The amplifier-based delay units 502-508 and the summers 510-516 can be implemented in a compact layout structure to ensure high signal path bandwidth. Note that the pipelined structure of the summers enables the FIR receive filter to be extended or contracted in a modular fashion. Further, the propagation delay of each summer adds to the delay introduced by the respective delay unit. That is, consider the inputs to summer 516. Relative to the analog input signal, the other summer input is delayed by signal propagation time through delay unit 502 and summer 514. A similar delay exists between the input signals of summers 514, 512, and (if the FIG. 5B variation is used) summer 510. This design enables the propagation delay to be shared between the delay units and a respective summer, potentially relaxing design requirements for the delay units. The FIG. 5B variation introduces an additional summer 509 with one input set at zero, so that the final delay unit 508 need not be implemented any differently from the preceding delay units. As will be seen below, however, the design similarities between preferred summer and delay unit implementations will enable the additional summer 509 to be replaced by an additional delay unit if desired.

Turning now to implementation of the delay units and summers, we note that waveforms passing through these elements should ideally experience only scaling and delay, without distortion of the waveform shapes. The ideal, unit gain delay cell has a transfer function of $$H(s) = e^{-s\tau},$$

where s is the Laplace Transform variable and $\tau$ is the desired time delay. Though this transfer function is not physically realizable, it serves as a starting point for this analysis. A first-order approximation is provided by the all-pass filter transfer function $$H(s) = \frac{1 - s \cdot \tau}{1 + s \cdot \tau},$$

which has a numerator and denominator with the same magnitude for all imaginary values of s, i.e., at all frequencies. The numerator, which provides a right-half-plane zero, and the denominator, which provides a left-half-plane pole, contribute equally to phase delay, producing an "in-band" (low frequency) group delay of $2\tau$. In other words, the right-half-plane zero is a key to obtaining this "double time constant" delay.

By analogy, even if a physically-implemented filter fails to fully realize the ideal all-pass filter response, the introduction of a right-half-plane zero can still increase the effective delay achievable with a given time constant for the circuit. Thus, for example, even an amplifier that is bandlimited due to unavoidable parasitic poles in the system response, can potentially achieve a larger delay. Conversely, a desired delay can be achieved with reduced time constants in the circuit design, thereby enhancing the circuit's bandwidth and reducing signal distortion.

Figure 6A:
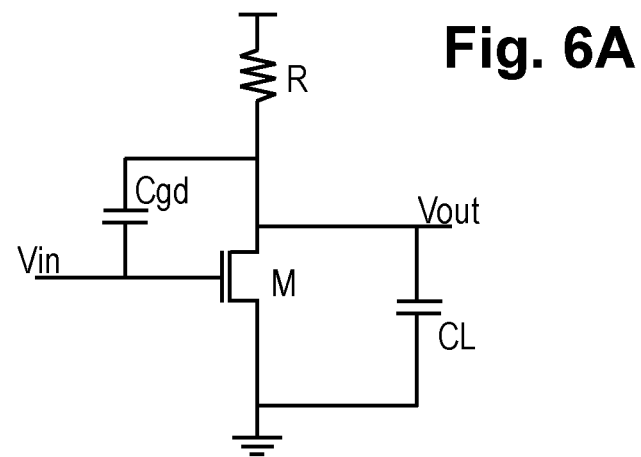
FIG. 6A shows an illustrative all pass filter.

FIG. 6A is a circuit schematic for a common source amplifier that can approximate an all-pass filter transfer function in the multi-GHz frequency range. Capacitance CL represents the load capacitance on the output line, which is charged to provide an output voltage Vout via a bias resistance R. A metal-oxide-semiconductor field-effect transistor (MOSFET) M is coupled across the capacitance CL to control the output voltage. An input voltage Vin is coupled to the gate of transistor M, controlling current flow between the drain and source terminals of the transistor in proportion to the input voltage and thus controlling the output voltage inversely to the input voltage.

Importantly, the common source amplifier of FIG. 6A includes a gate-drain capacitance Cgd that provides a feed-forward path and generates a right-half-plane zero. The load capacitance prevents the amplifier's transfer function from achieving an ideal all-pass response, instead providing (assuming that the common source amplifier has a low-frequency gain of unity, i.e., gm*RL=1):

$$H(s) = \frac{1 - s \cdot \tau_1}{1 + s \cdot \tau_2}$$

with the right-half-plane zero located at:

$$z = \frac{1}{\tau_1} = +\frac{1}{R \cdot C_{gd}}$$

and a left-hand-plane pole located at:

$$p = -\frac{1}{\tau_2} = -\frac{1}{R \cdot (C_{gd} + C_L)}$$

Figure 6B:
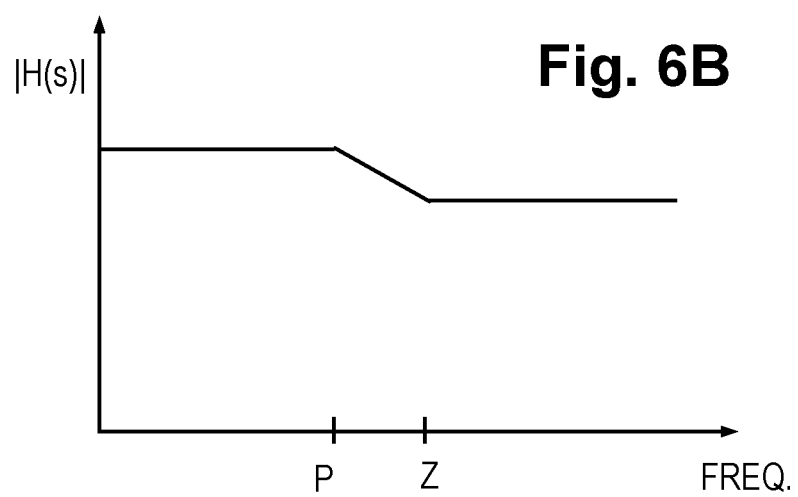
FIG. 6B is a Bode plot for an all pass filter with misaligned pole and zero values.

Inspection reveals that the pole's frequency is lower than the zero's frequency, yielding the Bode plot shown in FIG. 6B, which reveals moderate attenuation at higher frequencies. The larger the separation between the pole and zero frequencies, the greater the high frequency attenuation and distortion of the signal.

The amplifier's response more closely approaches the ideal when the load capacitance is minimized, flattening the response magnitude and making the time constants determined mainly by R*Cgd. Accordingly, a delay unit employing a common source amplifier preferably avoids capacitive loading of the output line. Notably, the common source amplifier itself (as provided in FIG. 6A) has a capacitively-loaded input, making it undesirable to chain multiple common source amplifier stages together without some form of isolation. Such isolation may be achieved via the use of an output buffer, e.g., a source follower stage, also having a high bandwidth and comparably small time constant.

Figure 7:
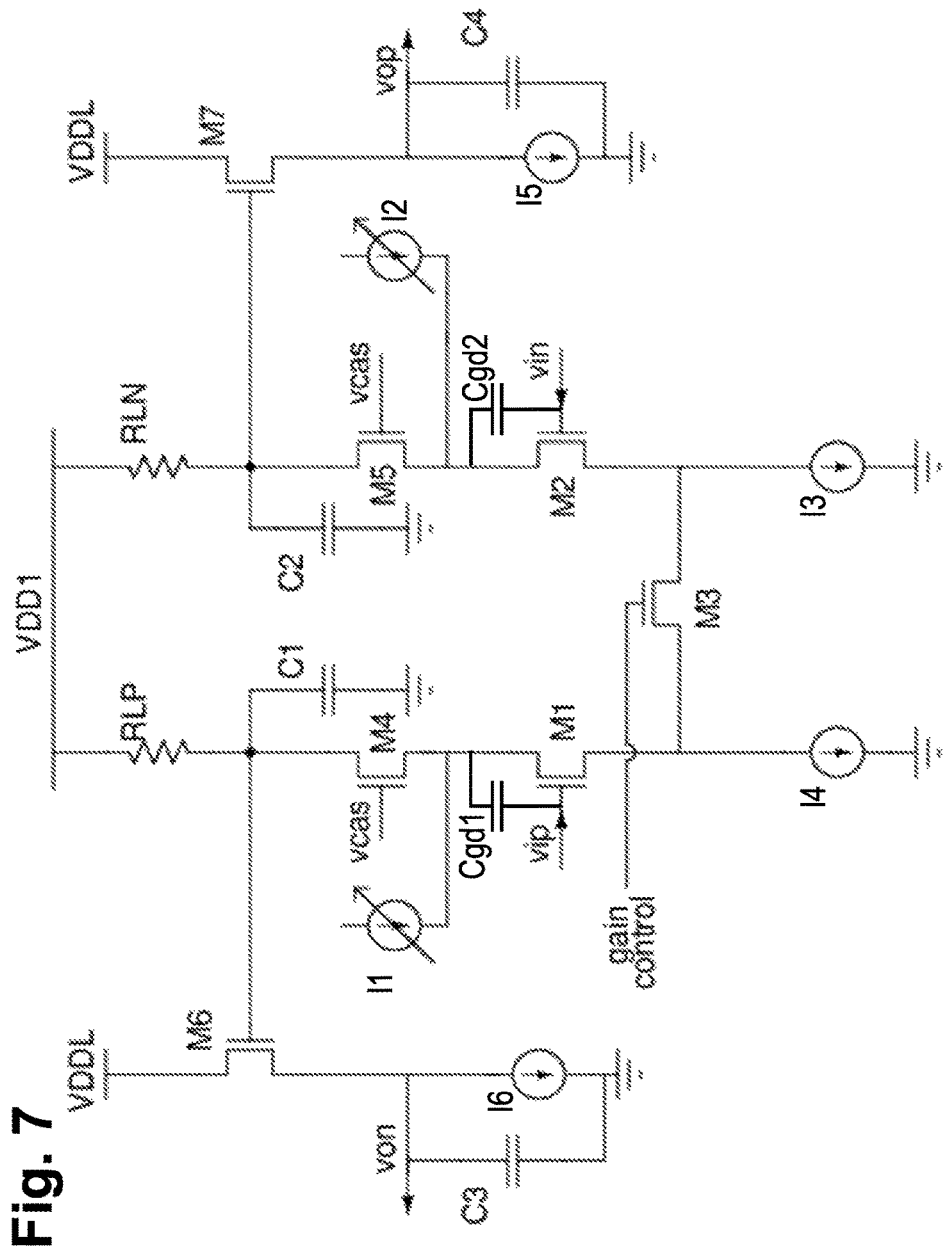
FIG. 7 shows an illustrative amplifier-based delay cell for a high-rate delay chain.

FIG. 7 shows an illustrative amplifier-based delay cell implementation for the delay units of FIG. 5A. Note that multiple delay cells may be chained in sequence to create a delay unit having the desired delay interval.

For explanatory purposes, the illustrated delay cell may be viewed as a source-degenerated, differential, cascode amplifier (common source amplifier with a current buffer) with a high-speed output buffer stage. The analog input signal is applied in the form of differential input voltages $V_{iP}$ and $V_{iN}$ to the gates of N-channel metal-oxide-semiconductor (NMOS) transistors M1 and M2. The source terminal of transistor M1 is coupled to a constant current sink 14 and the source terminal of transistor M2 is similarly coupled to a constant current sink 13. A third NMOS transistor M3 is coupled between the two source terminals of M1 and M2 to vary the resistance therebetween in response to a gain control signal. The drain terminals of M1 and M2 responsively draw currents that differ by a (negatively) amplified amount, with a gain determined by the gain control signal.

An adjustable current source I1 may be coupled to the drain terminal of transistor M1. An independently adjustable current source I2 may be coupled to the drain terminal of transistor M2. Current sources I1 and I2 can be used to control common mode and offset voltage to obviate any need for series coupling capacitors along the signal path. The drain terminal of transistor M1 is further coupled to the source terminal of a cascode transistor M4 having a drain terminal coupled to a supply voltage $V_{DD1}$ via a load resistance $R_{LP}$. The drain terminal of transistor M2 is similarly coupled to the source terminal of a second cascode transistor M5 having a drain terminal coupled to the supply voltage $V_{DD1}$ via a load resistance $R_{LN}$. The load resistances $R_{LP}$ and $R_{LN}$ translate the (adjusted) drain currents from M1 and M2 into a differential voltage signal between the drain terminals of transistors M4 and M5.

Gate-drain capacitances Cgd1 and Cgd2 are provided between the gates and drains of transistors M1 and M2, respectively, to provide the right-half-pane zeros and desired phase delays discussed previously. Given the high signal frequencies under consideration here (above 10 GHz) and the corresponding small delay requirements, the values of Cgd1 and Cgd2 are expected to be on the order of a few femtofarads, e.g., between about 2 fF and 10 fF when implementing a 50 GHz to 100 GHz equalizer design with a 28 nm to 16 nm MOS manufacturing process. Such values can be readily achieved by adjusting the input wire layouts or providing a small metal-oxide-metal (MOM) capacitor to provide the desired capacitive coupling. Thus the desired capacitive coupling may be achieved without requiring a discrete element or at least without requiring any significant increase in the delay cell's area. Nevertheless, these capacitances are intentionally provided to provide feedforward paths for the input signal voltages $V_{iP}$, $V_{iN}$, yielding the desired right-half-plane zero.

A parasitic capacitance C1 is shown coupled between ground and the drain terminal of transistor M4, and a second parasitic capacitance C2 is shown coupled between ground and the drain terminal of transistor M5. Parasitic capacitances C3 and C4 are shown coupled between ground and the delay cell output terminals carrying differential output voltages $V_{oN}$ and $V_{oP}$, respectively. These parasitic capacitances C1-C4 represent the load capacitance of conductors to, and input nodes for, subsequent stages, and are included here solely for modeling the behavior of the circuit. They would not be included as discrete elements of a real-world implementation. The intrinsic nature of these parasitic capacitances creates unavoidable poles for the all-pass filter response in the frequency range of interest, so it is not expected to be necessary to provide any intentionally-added poles. Parasitic capacitances C1, C2 correspond to the load capacitance CL of FIG. 6A, and to minimize the pole-zero mismatch it is desired that these capacitances be minimized, and kept from adding with C3,C4.

NMOS transistor M6 is configured as a source follower to isolate the parasitic capacitance C3 from transistor M4, and NMOS transistor M7 is configured as a source follower to isolate the parasitic capacitance C4 from transistor M5. That is, the drain terminal voltage from transistor M4 is coupled to the gate of NMOS transistor M6, which has its drain terminal coupled to a supply voltage $V_{DDL}$ and its source terminal coupled to a constant current sink 16. The supply voltage $V_{DDL}$ may be the same as supply voltage $V_{DD1}$, but in general can be lower because output transistor M6 is not in a cascode arrangement. The use of a lower $V_{DDL}$ may reduce the total power consumption of the delay unit. Conversely, supply voltage $V_{DD1}$ should be high enough to ensure current flow through the load resistances sufficient to provide the desired voltage swing. Similarly, the drain terminal voltage from transistor M5 is coupled to the gate of NMOS transistor M7, which has its drain terminal coupled to a supply voltage $V_{DDL}$ and its source terminal coupled to a constant current sink 15. The source terminal of output transistor M6 provides an output voltage $V_{oN}$, while the source terminal of output transistor M7 provides output voltage $V_{oP}$.

Because each delay cell is implemented by the cascade of a common source (cascode) stage and an output buffer (source follower) stage, the delay cell's total group delay is the sum of the two first-order stages. Each delay unit 502-508 may include multiple delay cells to further increase the number of first order stages that combine to make up the total delay. Breaking the desired 35.7 ps delay into two approximately equal first-order all-pass filter delays of about 18 ps (yielding a 8.88 GHz bandwidth for each stage), the cascaded stages provide a delay unit with a 3 dB bandwidth of 5.71, which is a 28% improvement over the previously-mentioned 4.46 GHz bandwidth. If two delay cells are used to break the desired 35.7 ps delay into four approximately equal first-order delays of about 9 ps each (yielding a 17.7 GHz bandwidth for each stage), the delay unit's 3 dB bandwidth increases to 7.68 GHz, a 72% improvement. If it were feasible to decrease the first-order delays to less than about 9 ps, additional stages could be employed to provide additional bandwidth gains. However, it is believed that only marginal returns are achievable at the cost of greatly increased power consumption.

A potentially important advantage of FIG. 7's delay cell design is the independence of the gain from the delay. The gain is adjusted by transistor M3 in the common source stage, where the delay is largely determined by the product of the load resistance ($R_{LP}$ or $R_{LN}$) with the capacitances Cgd1 or Cgd2, and is insensitive to changes in the drain-source resistance of transistor M3, which controls the stage's gain. Because a delay cell needs to drive the inputs of another delay cell (alone or in combination with a summer), an allowance should be made for potentially long routing wires that might present significant contributions to parasitic loading capacitances C3 and C4. The source follower buffer stage isolates such load capacitance from the source degenerated common source stage, and by providing a low output resistance it ensures both stages have a sufficiently high bandwidth.

Common mode control currents I1 and I2 may be used to ensure that the output voltages $V_{oP}$ and $V_{oN}$ have the same common mode voltage as the input voltages $V_{iN}$ and $V_{iP}$. This feature enables direct coupling of multiple delay units without intervening coupling capacitors that would consume large areas and degrade bandwidth due to its inevitable parasitic coupling capacitance to ground and other wires. I1 and I2 can also cancel offset voltages due to each stage's random variations. The transistor current mirrors that implement I1 and I2 will have parasitic device capacitance and wire capacitance. Cascode devices M4 and M5 minimize the negative impact on bandwidth by such capacitances.

Figure 8:
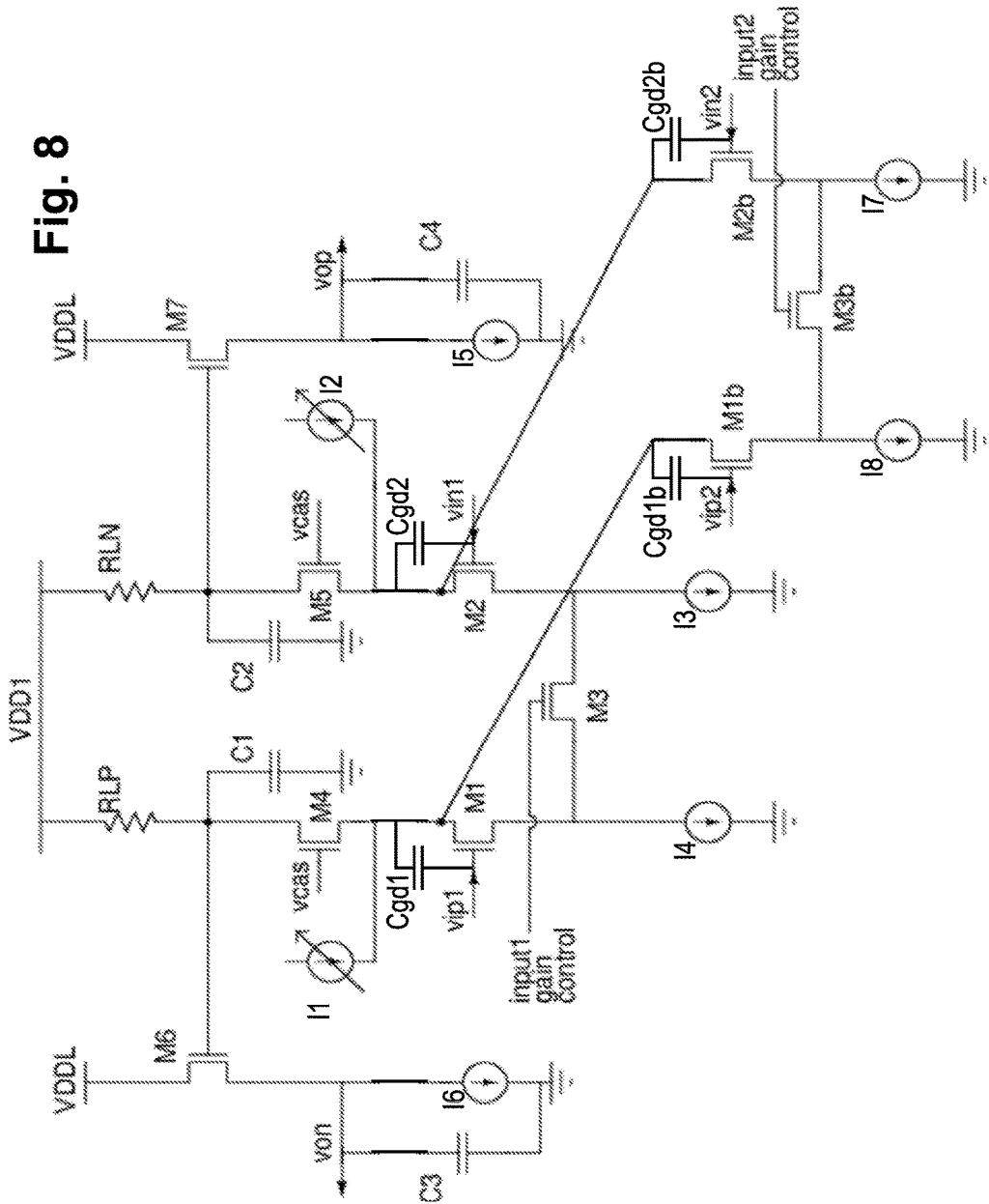
FIG. 8 shows an illustrative high-rate weighted summing amplifier.

FIG. 8 shows an illustrative differential amplifier-based two-input summer implementation. It includes the implementation components and structure of FIG. 7's illustrative delay cell, with NMOS transistors M1 and M2 accepting the differential voltages of a first input signal $V_{iP1}$ and $V_{iN1}$ on their gates. As before, the gain is set by gain control transistor M3.

Additional NMOS transistors M1$b$ and M2$b$ are provided to accept the differential voltages of a second input signal $V_{iP2}$ and $V_{iN2}$ on their gates. The source terminal of transistor M1$b$ is coupled to a constant current sink 18 and the source terminal of transistor M2$b$ is similarly coupled to a constant current sink 17. An additional gain control transistor M3$b$ is coupled between the two source terminals of M1$b$ and M2$b$ to vary the resistance therebetween in response to a gain control signal for the second input. The drain terminals of M1$b$ and M2$b$ responsively draw currents that differ by a (negatively) amplified amount of the second input signal, with a gain determined by the second gain control signal. The drain terminal of M1$b$ couples to the drain terminal of M1 so that their current draws combine additively. Similarly, the drain terminal of M2$b$ coupled to the drain terminal of M2 so that their current draws combine additively. The drain terminal voltages of M4, M5, and accordingly the output voltages $V_{oN}$ and $V_{oP}$ are thus the differential weighted sums of the differential inputs, with the coefficients determined by the gain control signals. The gain of each delay unit and each summer unit's input can be independently adjusted. This provides for additional flexibility in setting FFE coefficients, and reduces the required gain control range of each unit.

Note that a gate-drain capacitance Cgd may be intentionally added to each of the input transistors M1, M2, M1$b$, M2$b$, to make the propagation delay of the summer units comparable to the propagation delay of the delay cells, further reducing the group delay required for each delay unit. Alternatively, the gate-drain capacitances may be left at their minimal intrinsic values to reduce loading on the delay unit output lines.

Figure 9:
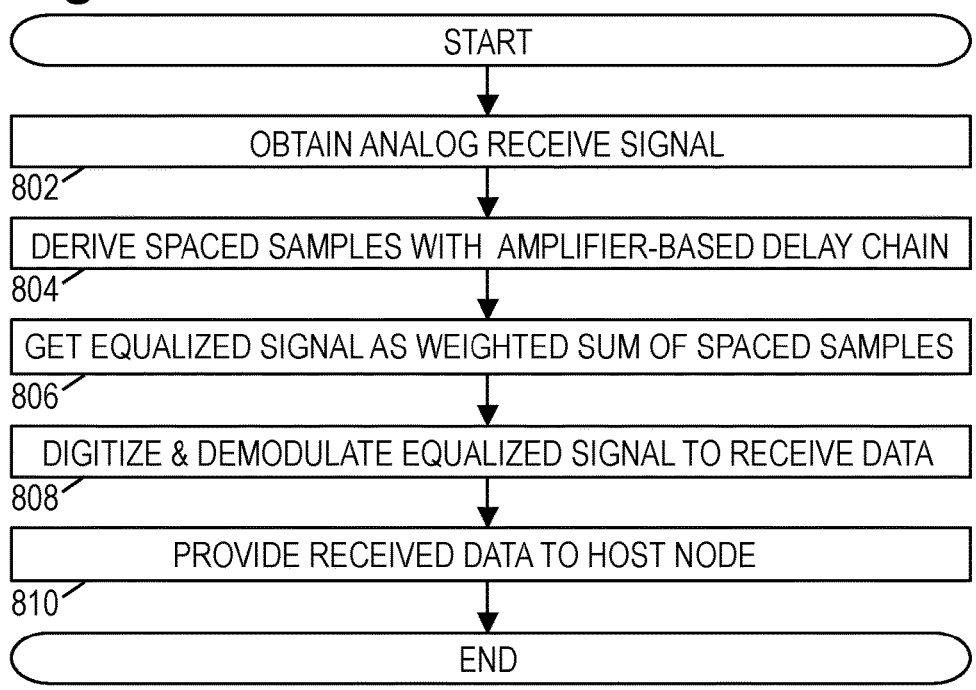
FIG. 9 is a flowchart of an illustrative method for equalizing high speed receiving devices.

FIG. 9 is a flowchart of an illustrative method for equalizing high speed receiving devices using an FFE module that includes an FIR analog filter, a clock recovery module, and an analog to digital converter. The method begins in block 802 with obtaining an analog receive signal, e.g., with an optical sensor. In block 804 the FFE module uses an amplifier-based delay chain of an FIR receive filter to derive a set of equally-delayed versions of the analog receive signal. In block 806, the FIR analog receive filter weights and sums the variously-delayed versions of the receive signal to produce an equalized signal. In block 808, the FFE module's analog to digital converter digitizes the equalized signal to obtain a sequence of symbol decisions. The sequence may be demodulated by the FFE module or by a downstream component to extract the received data. The received data is supplied to the host node in block 810.

Numerous alternative forms, equivalents, and modifications will become apparent to those skilled in the art once the above disclosure is fully appreciated. For example, the foregoing description focuses on implementations using NMOS transistors due to the higher carrier mobilities typically associated with such transistors, but other transistor technologies could readily be employed including PMOS, JFET, and BJT. Implementations using non-differential signals are also expected to be possible. It is intended that the claims be interpreted to embrace all such alternative forms, equivalents, and modifications that are encompassed in the scope of the appended claims.

What is claimed is:

1. A channel interface module comprising:
   multiple amplifier-based delay circuits arranged in a sequential chain to convert an analog input signal into a set of increasingly-delayed analog signals that are weighted and combined together with the analog input signal to form an equalized signal, each amplifier-based delay circuit in the sequential chain including one or more delay cells each employing a cascode amplifier with a source follower output stage to introduce additional delay to the analog input signal, the cascode amplifier within each delay cell having:
   a MOS (metal-oxide-semiconductor) transistor with a gate that receives a delay cell input signal; and
   a gate-to-drain capacitance in excess of an intrinsic value for the MOS transistor;
   a symbol decision circuit operating on the equalized signal to obtain a sequence of symbol decisions; and
   an interface that extracts received data from the sequence of symbol decisions.

2. The module of claim 1, wherein the gate-to-drain capacitance is at least 2 femtofarads (fF) and no more than 10 fF.

3. The module of claim 2, wherein the gate-to-drain capacitance is provided by routing a conductor to the gate in close proximity to a drain of the MOS transistor or a conductor connected to said drain.

4. A channel interface module comprising:
   multiple amplifier-based delay circuits arranged in a sequential chain to convert an analog input signal into a set of increasingly-delayed analog signals that are weighted and combined together with the analog input signal to form an equalized signal, each amplifier-based delay circuit in the sequential chain including a sequence of multiple delay cells each employing a cascode transistor for a common source amplifier and a source follower stage including a transistor configured to provide a source follower output to introduce additional delay to the analog input signal;
   a symbol decision circuit operating on the equalized signal to obtain a sequence of symbol decisions: and
   an interface that extracts received data from the sequence of symbol decisions.

5. A channel interface module comprising:
   multiple amplifier-based delay circuits arranged in a sequential chain to convert an analog input signal into a set of increasingly-delayed analog signals that are weighted and combined together with the analog input signal to form an equalized signal, each amplifier-based delay circuit including one or more delay cells each employing a differential common source amplifier with adjustable source degeneration to introduce additional delay to the analog input signal;
   wherein the differential common source amplifier within each delay cell comprises:
   a pair of MOS transistors with gates that receive a differential input signal to the delay cell and drains that each are coupled to the respective gate by a gate-to-drain capacitance in excess of an intrinsic value for the MOS transistors;
   a symbol decision circuit operating on the equalized signal to obtain a sequence of symbol decisions; and
   an interface that extracts received data from the sequence of symbol decisions.

6. The module of claim 5, wherein each of the one or more delay cells further includes:
   cascode transistors for the differential common source amplifier; and
   a source-follower including transistors configured to drive differential output signals from that delay cell.

7. The module of claim 6, wherein each of the one or more delay cells further includes:
   adjustable current sources coupled to the cascode transistors to set a common mode voltage of the differential output signals to bias a subsequent delay cell without series capacitive coupling.

8. The module of claim 6, further comprising an arrangement of amplifier-based summer circuits that weight and combine together the set of increasingly-delayed analog signals together with the analog input signal to form equalized signals, wherein each amplifier-based summer circuit comprises:
   a first differential common source amplifier for a first of two input signals;
   a second differential common source amplifier for a second of the two input signals, the first and second differential common source amplifiers additively combining currents through a cascode transistor stage, each of the two differential common source amplifiers having adjustable source degeneration for independent gain control; and
   a source-follower stage that drives differential output signals from the amplifier-based summer circuit.

9. A method for providing high speed equalization, the method comprising:
   obtaining an analog receive signal from a communications channel;
   using a chain of amplifier-based delay circuits to convert the analog receive signal into a set of increasingly-delayed analog signals that are weighted and combined together with the analog received signal to form an equalized signal, each of said amplifier-based delay circuits having one or more delay cells, each of said one or more delay cells:
      receiving a delay cell input signal with a gate of a MOS transistor in a cascode amplifier configuration, said receiving including coupling the input signal from the gate to a drain of the MOS transistor with a gate-to-drain capacitance in excess of an intrinsic value for the MOS transistor, and
      buffering an output of that delay cell with a source follower output stage;
   sampling the equalized signal to obtain a sequence of symbol decisions; and
   extracting received data from the sequence of symbol decisions.

10. A method for providing high speed equalization, the method comprising:
    obtaining an analog receive signal from a communications channel, the analog receive signal being a differential signal;
    using a chain of amplifier-based delay circuits to convert the analog receive signal into a set of increasingly-delayed analog signals that are weighted and combined together with the analog received signal to form an equalized signal, each amplifier-based delay circuit accepting a differential input signal with a differential cascade amplifier stage including cascade transistors and providing a differential output signal by a source follower stage including transistors with an output buffer stage;
    sampling the equalized signal to obtain a sequence of symbol decisions; and
    extracting received data from the sequence of symbol decisions.

11. The method of claim 10, wherein each of said amplifier-based delay circuits comprises one or more delay cells, and wherein said using a chain of amplifier-based delay circuits includes, for each delay cell:
    receiving a differential delay cell input signal with gates of two MOS transistors in a differential common source amplifier configuration; and
    buffering a differential output of that delay cell with a source-follower including transistors configured to drive differential output signals.

12. The method of claim 11, wherein said receiving includes coupling each gate to a respective drain of the MOS transistors with a gate-to-drain capacitance in excess of an intrinsic value for that MOS transistor.

13. The method of claim 12, wherein each gate-to-drain capacitance is provided by a routing gate conductor in close proximity to a respective drain or in close proximity to a conductor connected to said respective drain.

* * * * *